(12) United States Patent  
Park et al.

(10) Patent No.: US 8,294,158 B2
(45) Date of Patent: Oct. 23, 2012

(54) THIN FILM TRANSISTOR, METHOD OF FABRICATING THE SAME, AND ORGANIC LIGHT EMITTING DIODE DISPLAY DEVICE INCLUDING THE THIN FILM TRANSISTOR (75) Inventors: Byoung-Keon Park, Yongin (KR); Jin-Wook Seo, Yongin (KR); Tae-Hoon Yang, Yongin (KR); Kil-Won Lee, Yongin (KR); Dong-Hyun Lee, Yongin (KR); Maxim Lisachenko, Yongin (KR); Ki-Yong Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 178 days.

(21) Appl. No.: 12/649,718

(22) Filed: Dec. 30, 2009
(Under 37 CFR 1.47)

(65) Prior Publication Data
US 2010/0163885 A1 Jul. 1, 2010

(30) Foreign Application Priority Data

Dec. 30, 2008 (KR) ........................ 10-2008-0137241

(51) Int. Cl.
*H01L 27/14* (2006.01)
*H01L 27/12* (2006.01)
*H01L 27/20* (2006.01)
*H01L 27/36* (2006.01)

(52) U.S. Cl. .................. 257/72; 257/347; 257/E29.117; 438/486; 438/487

(58) Field of Classification Search .................... 257/66, 257/72, 75, 347; 438/486, 487
See application file for complete search history.

(56) References Cited

U.S. PATENT DOCUMENTS

| 2003/0094611 A1* | 5/2003 | Hayakawa | 257/49 |
| 2006/0040434 A1* | 2/2006 | Park et al. | 438/151 |
| 2008/0296565 A1* | 12/2008 | Park et al. | 257/40 |

FOREIGN PATENT DOCUMENTS

| JP | 08181325 A | * 7/1996 |
| KR | 10-2006-0017410 | 2/2006 |
| KR | 10-0685848 | 2/2007 |
| KR | 10-0770266 | 10/2007 |

* cited by examiner

*Primary Examiner* — Matthew Landau
*Assistant Examiner* — Khaja Ahmad
(74) *Attorney, Agent, or Firm* — H.C. Park & Associates, PLC (57) ABSTRACT A thin film transistor (TFT) includes a substrate, a semiconductor layer disposed on the substrate and including source and drain regions, each having a first metal catalyst crystallization region and a second metal catalyst crystallization region, and a channel region having the second metal catalyst crystallization region, a gate electrode disposed in a position corresponding to the channel region of the semiconductor layer, a gate insulating layer interposed between the semiconductor layer and the gate electrode to electrically insulate the semiconductor layer from the gate electrode, and source and drain electrodes electrically insulated from the gate electrode and electrically connected to the source and drain regions, respectively. An OLED display device includes the thin film transistor and a first electrode, an organic layer, and a second electrode electrically connected to the source and drain electrodes.

26 Claims, 8 Drawing Sheets

THIN FILM TRANSISTOR, METHOD OF FABRICATING THE SAME, AND ORGANIC LIGHT EMITTING DIODE DISPLAY DEVICE INCLUDING THE THIN FILM TRANSISTOR

CROSS-REFERENCE TO RELATED APPLICATIONS

This application claims the benefit of Korean Patent Application No. 10-2008-0137241, filed Dec. 30, 2008, the disclosure of which is incorporated herein by reference.

BACKGROUND OF THE INVENTION

1. Field of the Invention

Aspects of the present invention relate to a thin film transistor (TFT), a method of fabricating the same, and an organic light emitting diode (OLED) display device including the TFT. More particularly, aspects of the present invention relate to a TFT whose electrical properties are improved by controlling the concentration of a metal catalyst of a crystallized semiconductor layer, a method of fabricating the TFT, and an OLED display device including the TFT.

2. Description of the Related Art

In general, a polycrystalline silicon (poly-Si) layer is widely used as a semiconductor layer for a thin film transistor (TFT) because polycrystalline silicon has high field-effect mobility, is suitable for a high-speed operating circuit, and may be used to configure a complementary-metal-oxide-semiconductor (CMOS) circuit. A TFT using a poly-Si layer may function as an active device of an active-matrix liquid crystal display (AMLCD) or a switching device or a driving device of an organic light emitting diode (OLED). Methods of crystallizing an amorphous silicon (a-Si) layer into a poly-Si layer may include solid phase crystallization (SPC), excimer laser annealing (ELA), metal induced crystallization (MIC), and metal induced lateral crystallization (MILC).

Specifically, the SPC method includes annealing an a-Si layer for several hours to several tens of hours at temperatures below 700° C. (Temperatures above 700° are not used in annealing an a-Si layer to be used in a TFT for a display device because the glass substrate used in the TFT becomes deformed at such temperatures). The ELA method includes partially heating an a-Si layer to a high temperature in a short amount of time by irradiating excimer laser beams onto the a-Si layer. The MIC method includes bringing a metal, such as nickel (Ni), palladium (Pd), gold (Au), or aluminum (Al), into contact with an a-Si layer or injecting the metal into the a-Si layer to induce a phase transition from the a-Si layer to a poly-Si layer. The MILC method includes sequentially inducing the crystallization of an a-Si layer while laterally diffusing silicide formed by a reaction of a metal with silicon.

However, since the SPC method involves annealing a substrate at a high temperature for a long period of time, great damage may be done to the substrate, even at temperatures below 700° C. The ELA method not only requires expensive laser apparatuses but also may result in protrusions being formed in the surface of the poly-Si layer, which may degrade interface characteristics between a semiconductor layer and a gate insulating layer.

Recently, a vast amount of research has been being conducted on methods of crystallizing an a-Si layer using a metal catalyst because the a-Si layer may be crystallized at a lower temperature for a shorter amount of time than in an SPC method. Typical methods of crystallizing an a-Si layer using a metal catalyst are the MIC method, the MILC method, and a super grain silicon (SGS) method.

A leakage current significantly affects the characteristics of a TFT. In particular, a metal catalyst may remain in a channel region of a semiconductor layer that is crystallized using the metal catalyst, thereby increasing the leakage current. Accordingly, if the concentration of the metal catalyst remaining in the channel region is not controlled, the leakage current of the TFT may increase, thereby degrading its electrical properties.

SUMMARY OF THE INVENTION

Aspects of the present invention provide a thin film transistor (TFT) in which the amount of a metal catalyst remaining in a channel region of a semiconductor layer that is crystallized using the metal catalyst is minimized to improve characteristics, a method of fabricating the TFT, and an organic light emitting diode (OLED) display device including the TFT.

According to an aspect of the present invention, a TFT includes: a substrate; a semiconductor layer disposed on the substrate and including source and drain regions, each having a first metal catalyst crystallization region and a second metal catalyst crystallization region, and a channel region having the second metal catalyst crystallization region; a gate electrode disposed in a position corresponding to the channel region of the semiconductor layer; a gate insulating layer interposed between the semiconductor layer and the gate electrode to electrically insulate the semiconductor layer from the gate electrode; and source and drain electrodes electrically insulated from the gate electrode and electrically connected to the source and drain regions, respectively.

According to another aspect of the present invention, a method of fabricating the above-described TFT is provided.

According to still another aspect of the present invention, an OLED display device includes: a substrate; a semiconductor layer disposed on the substrate and including source and drain regions, each having a first metal catalyst crystallization region and a second metal catalyst crystallization region, and a channel region having the second metal catalyst crystallization region; a gate electrode disposed in a position corresponding to the channel region of the semiconductor layer; a gate insulating layer interposed between the semiconductor layer and the gate electrode to electrically insulate the semiconductor layer from the gate electrode; source and drain electrodes electrically insulated from the gate electrode and electrically connected to the source and drain regions, respectively; and a first electrode, an organic layer, and a second electrode electrically connected to the source and drain electrodes.

According to still another aspect of the present invention, a semiconductor layer disposed on a substrate includes: a first metal catalyst crystallization region and a second metal catalyst crystallization region disposed to cover the first metal catalyst crystallization region, wherein crystal grains of the second metal catalyst crystallization region are larger than crystal grains of the first metal catalyst crystallization region.

According to still another aspect of the present invention, a method of forming a semiconductor layer including a first metal catalyst crystallization region and a second metal catalyst crystallization region includes: forming a first amorphous silicon layer on a substrate; forming a metal catalyst layer on the first amorphous silicon layer; annealing the substrate having the first amorphous silicon layer formed thereon such that the first amorphous silicon layer is crystallized to form the first metal catalyst crystallization region; forming a second amorphous silicon layer on the first metal catalyst crystallization region; and annealing the substrate having the first metal catalyst crystallization region and the second amorphous silicon layer formed thereon such that the second amorphous silicon layer is crystallized to form the second metal catalyst crystallization region Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIGS. 1A through 1G are cross-sectional views illustrating a method of forming a polycrystalline silicon (poly-Si) layer according to an exemplary embodiment of the present invention.

Figure 1A:
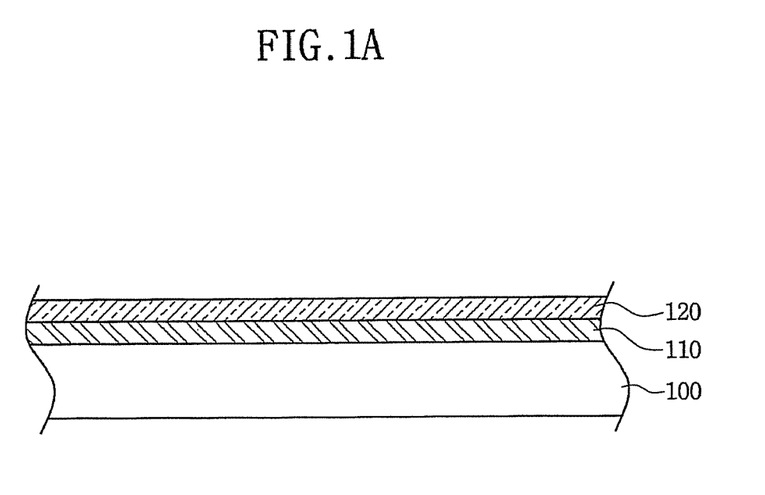
FIGS. 1A through 1G are cross-sectional views illustrating a method of forming a polycrystalline silicon (poly-Si) layer according to an exemplary embodiment of the present invention.

Referring to FIG. 1A, a buffer layer 110 is formed on a substrate 100, such as a glass substrate or a plastic substrate. The buffer layer 110 may be a single layer or multilayered structure that is formed of an insulating material, such as silicon oxide or a silicon nitride, using a chemical vapor deposition (CVD) process or a physical vapor deposition (PVD) process. The buffer layer 110 may prevent diffusion of moisture or impurities generated in the substrate 100 or control the transmission rate of heat during a crystallization process, thereby facilitating the crystallization of an amorphous silicon (a-Si) layer.

Thereafter, a first a-Si layer 120 is formed on the buffer layer 110. In this case, the first a-Si layer 120 may be formed using a CVD process or a PVD process. Also, a dehydrogenation process may be performed during or after the formation of the first a-Si layer 120, thereby reducing the hydrogen concentration of the silicon in the first a-Si layer 120.

The first a-Si layer 120 is then crystallized into a poly-Si layer. In the present exemplary embodiment, the crystallization of the first a-Si layer 120 into the poly-Si layer may be performed by a crystallization method using a metal catalyst, such as a metal induced crystallization (MIC) method, a metal induced lateral crystallization (MILC) method, or a super grain silicon (SGS) method. In this case, a crystallized poly-Si layer region is defined as a first metal catalyst crystallization region.

In the present exemplary embodiment, the SGS crystallization method among the above-described crystallization methods will now be described.

In the SGS crystallization method, the metal catalyst that diffuses into an a-Si layer is controlled to a low concentration such that the size of crystal grains ranges from several to several hundred μm. For example, in order to reduce the concentration of the metal catalyst diffusing into an a-Si layer, the SGS crystallization method may include forming a capping layer on the a-Si layer, forming a metal catalyst layer on the capping layer, and annealing the metal catalyst layer to diffuse the metal catalyst into the a-Si layer. Alternatively, the concentration of the metal catalyst that diffuses into an a-Si layer may be lowered by forming a metal catalyst layer at a low concentration without forming a capping layer.

Figure 1B:
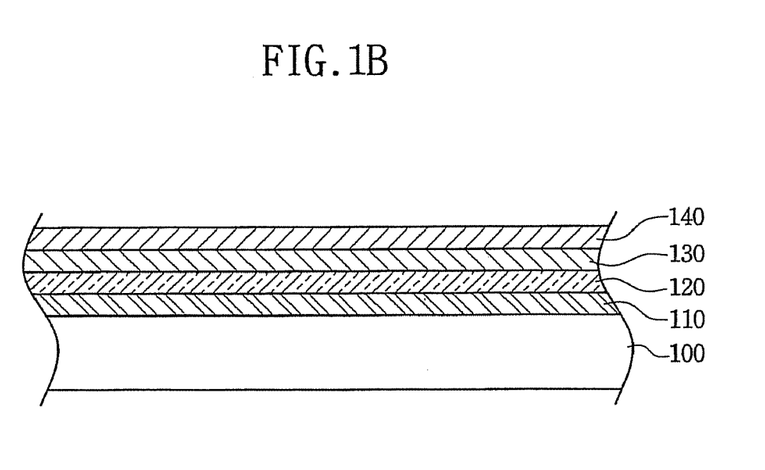

FIG. 1B is a cross-sectional view illustrating a process of forming a capping layer and a metal catalyst layer on the first a-Si layer. Referring to FIG. 1B, a capping layer 130 is formed on the first a-Si layer 120. The capping layer 130 may be a silicon nitride layer into which a metal catalyst diffuses during a subsequent annealing process or may be a double layer made up of a silicon nitride layer and a silicon oxide layer. The capping layer 130 may be formed using a CVD technique or a PVD technique. The capping layer 130 may be formed to a thickness of about 1 to 2000 Å. When the capping layer 130 is formed to a thickness of less than 1 Å, the capping layer 130 may not properly function to control the amount of metal catalyst that diffuses into the first a-Si layer 120. When the capping layer 130 is formed to a thickness of more than 2000 Å, the amount of metal catalyst that diffuses into the first a-Si layer 120 may be small, thereby hindering crystallization of the first a-Si layer 120.

Thereafter, a metal catalyst is deposited on the capping layer 130, thereby forming a metal catalyst layer 140. The metal catalyst may be selected from the group consisting of nickel (Ni), palladium (Pd), silver (Ag), gold (Au), aluminum (Al), tin (Sn), antimony (Sb), copper (Cu), terbium (Tr), and cadmium (Cd). For example, the metal catalyst may be Ni. The metal catalyst layer 140 may be formed to an areal density of about $10^{11}$ to $10^{15}$ atoms/cm$^2$ on the capping layer 130. When the metal catalyst layer 140 is formed to an areal density lower than about $10^{11}$ atoms/cm$^2$, only a small number of seeds may be formed, thereby precluding crystallization of the first a-Si layer 120 into a poly-Si layer. When the metal catalyst layer 140 is formed to an areal density of more than about $10^{15}$ atoms/cm$^2$, the amount of metal catalyst diffusing into the a-Si layer 120 is increased, providing a greater number of seeds spaced more closely together, thereby reducing the size of the crystal grains of the poly-Si layer. Also, amount of metal catalyst that remains in the poly-Si layer may be increased such that the characteristics of a semiconductor layer formed by patterning the poly-Si layer may be degraded.

Figure 1C:
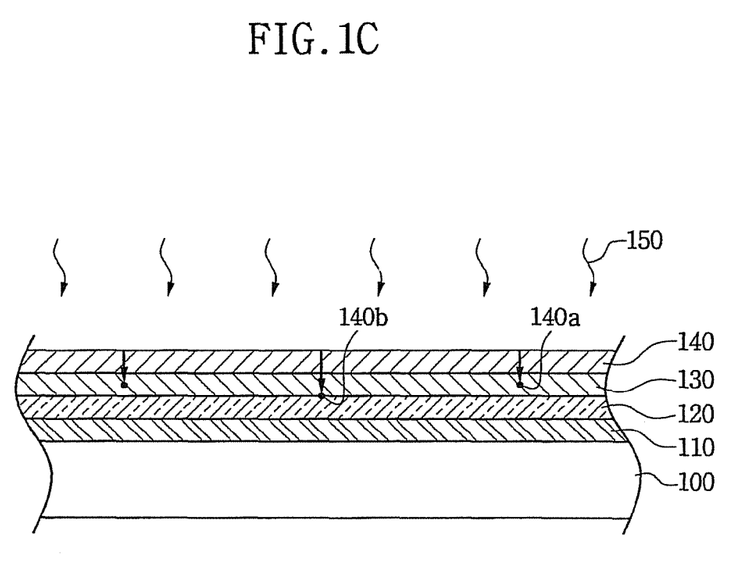

FIG. 1C is a cross-sectional view illustrating a process of annealing the substrate to diffuse the metal catalyst through the capping layer into a first a-Si layer.

Referring to FIG. 1O, the substrate 100 having the buffer layer 110, the first a-Si layer 120, the capping layer 130, and the metal catalyst layer 140 may be annealed (the annealing is symbolized by the curved arrows indicated by reference numeral 150) so that part of the metal catalyst of the metal catalyst layer 140 moves to the surface of the first a-Si layer 120. Specifically, only a small amount of metal catalyst out of the total amount of metal catalysts in the metal catalyst layer 140 diffuses all the way through the capping layer 130 onto the surface of the first a-Si layer 120, while a large amount of the metal catalyst neither reaches the first a-Si layer 120 nor passes through the capping layer 130. In FIG. 1C, reference numeral 140b indicates the metal catalyst that diffuses all the way onto the surface of the first a-Si layer 120, and reference numeral 140a indicates the metal catalyst that does not pass all the way through the capping layer 130.

Thus, the amount of metal catalyst that diffuses to the surface of the first a-Si layer 120 depends on the diffusion barrier capability of the capping layer 130, which may be closely related to the thickness of the capping layer 130. In other words, as the thickness of the capping layer 130 increases, the diffused amount of metal catalyst decreases and the size of crystal grains produced from the a-Si layer increases. Conversely, as the thickness of the capping layer 130 decreases, the diffused amount of metal catalyst increases and the size of the crystal grains produced from the a-Si layer decreases.

The annealing process 150 for diffusing the metal catalyst may be performed at a temperature of about 200 to 900° C., or as a more specific, non-limiting example, at a temperature of about 350 to 500° C., for several seconds to several hours. When the annealing process 150 is performed under the above-described time and temperature conditions, the deformation of the substrate 100 due to overheating may be prevented, and desired results may be expected in terms of fabrication cost and yield. The annealing process 150 may be performed using any one of a furnace process, a rapid thermal annealing (RTA) process, an ultraviolet (UV) process, and a laser process.

Figure 1D:
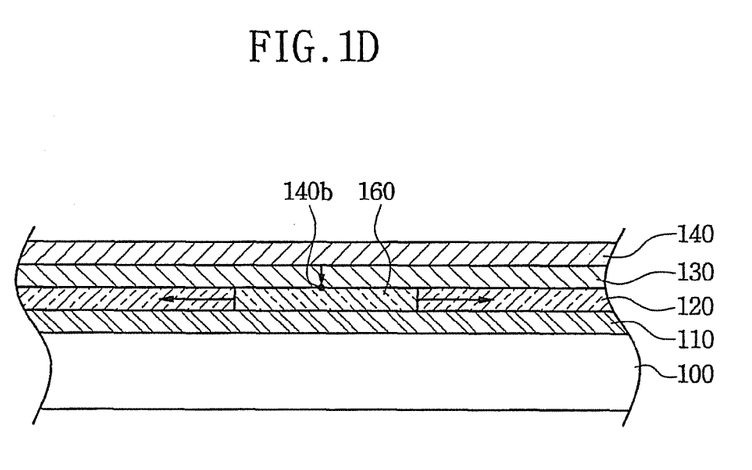

FIG. 1D is a cross-sectional view illustrating a process of crystallizing the first a-Si layer into a poly-Si layer using the diffused metal catalyst.

Referring to FIG. 1D, due to the presence of the metal catalyst 140b that has passed through the capping layer 130 and diffused into the surface of the first a-Si layer 120, the first a-Si layer 120 is crystallized into a first metal catalyst crystallization region 160. That is, the diffused metal catalyst 140b may combine with Si of the first a-Si layer 120 to form a metal silicide. The metal silicide may then form crystal nuclei (i.e., seeds) to promote crystallization of the first a-Si layer 120 into a poly-Si layer, thereby forming the first metal catalyst crystallization region 160, which may also be referred to as a first SGS crystallization region.

Although it is illustrated in FIG. 1D that poly-Si layer is formed by performing the annealing process on the resultant structure having the capping layer 130 and the metal catalyst layer 140 after the metal catalyst has diffused into the surface of the first a-Si layer 120 to form the metal silicide, it is also possible to form the poly-Si layer by first removing the capping layer 130 and the metal catalyst layer 140 and then performing the annealing process.

Figure 1E:
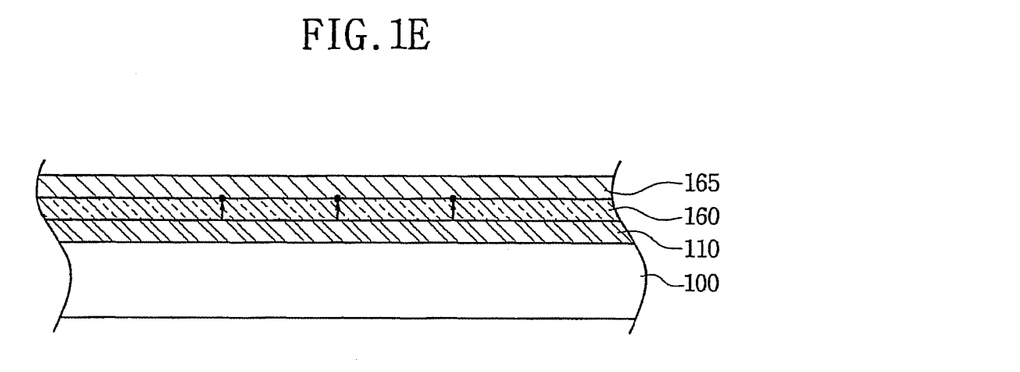
Figure 1F:
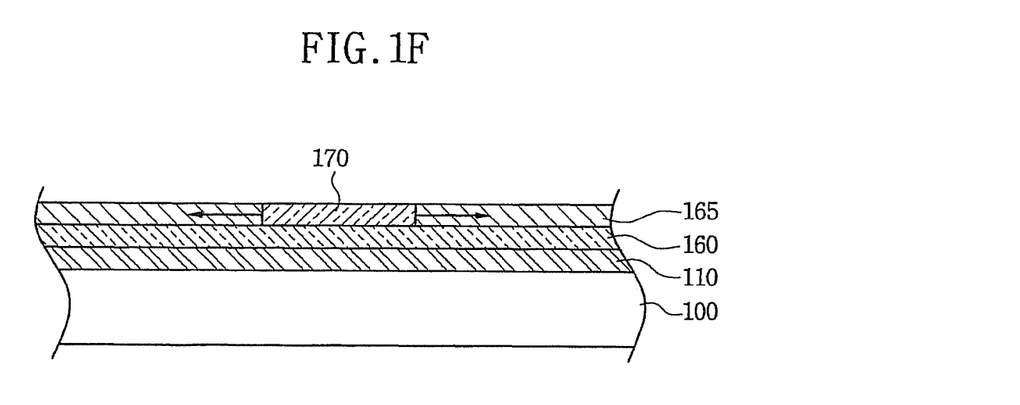
Figure 1G:
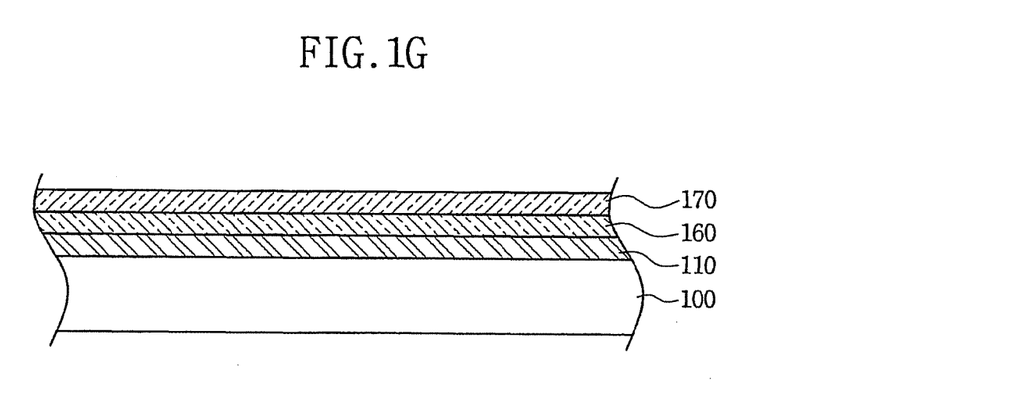

Referring to FIGS. 1E through 1G, after the crystallization process, the capping layer 130 and the metal catalyst layer 140 may be removed (if these layers were not removed before the crystallization). A second a-Si layer 165 is then formed on the first metal catalyst crystallization region 160.

Subsequently, an annealing process is performed in the same manner as when the first a-Si layer 120 is annealed. Thus, the metal catalyst remaining in the first metal catalyst crystallization region 160 diffuses into the second a-Si layer 165 to form seeds, thereby resulting in crystallization of the second a-Si layer 165 into a second metal catalyst crystallization region 170. The second metal catalyst crystallization region 170 is formed due to the metal catalyst remaining in the first metal catalyst crystallization region 160. The remaining amount of metal catalyst may be smaller in the second metal catalyst crystallization region 170 than in the first metal catalyst crystallization region 160. The second metal catalyst crystallization region 170 may be referred to as a second SGS crystallization region, since it is a region where the remaining metal catalyst of the first SGS crystallization region is diffused and crystallized.

Furthermore, crystal grains of the second metal catalyst crystallization region 170 (i.e., the second SGS crystallization region) may be about 3 to 4 times as large as those of the first metal catalyst crystallization region 160 (i.e., the first SGS crystallization region). Also, when the top surfaces of the first and second metal catalyst crystallization regions 160 and 170 are etched and observed, seeds may be found in the top surface of the first metal catalyst crystallization region 160, while neither seeds nor clear crystal grain boundaries may be seen in the top surface of the second metal catalyst crystallization region 170 because seeds are formed in a bottom surface of the second metal catalyst crystallization region 170 and grown upward. Therefore, the second metal catalyst crystallization region 170 may have smaller crystal grain boundaries than the first metal catalyst crystallization region 160 so that the second metal catalyst crystallization region 170 has smaller barriers to charge transport and better electrical properties than the first metal catalyst crystallization region 160.

Figure 1H:
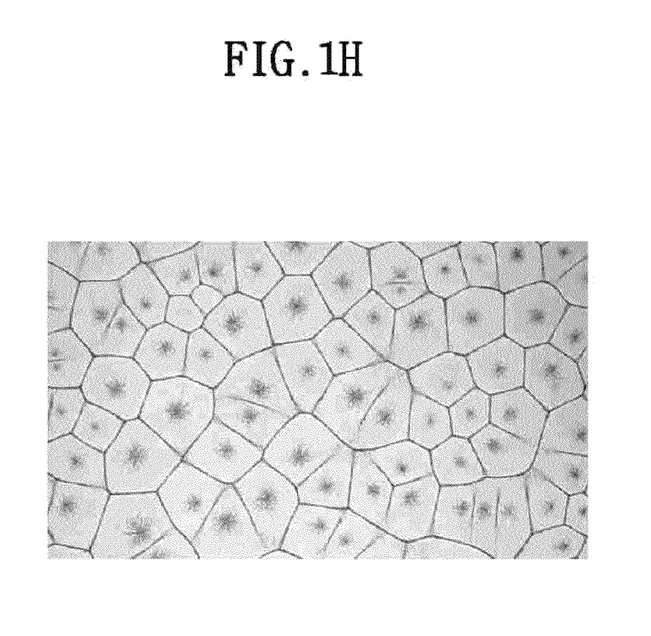
FIG. 1H is a photograph of a first metal catalyst crystallization region according to an exemplary embodiment of the present invention.
Figure 1I:
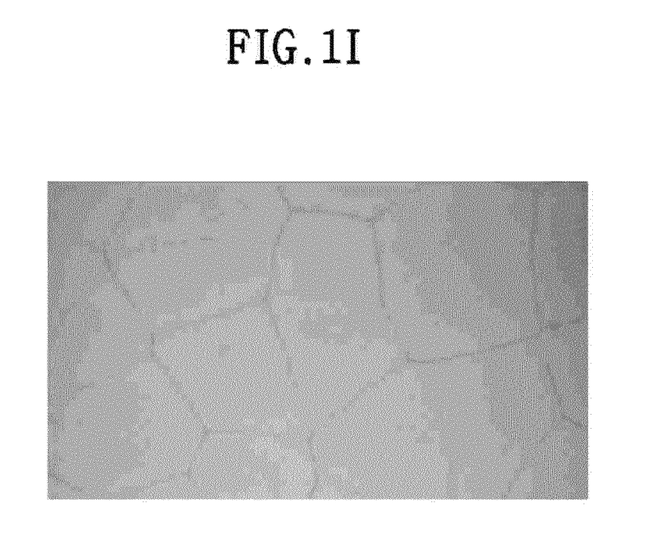
FIG. 1I is a photograph of a second metal catalyst crystallization region according to another exemplary embodiment of the present invention.

FIG. 1H is a photograph of the surface of a first metal catalyst crystallization region, and FIG. 1I is a photograph of the surface of a second metal catalyst crystallization region produced by the method described above.

Referring to FIG. 1H, which shows the surface of the first metal catalyst crystallization region 160, as described above, seeds can be easily seen in the crystal grains, and crystal grain boundaries are clear and well defined. In contrast, referring to FIG. 1I, which shows the surface of the second metal catalyst crystallization region 170 that is crystallized due to the remaining metal catalyst of the first metal catalyst crystallization region 170, crystal grain boundaries are unclear and no seeds are observed. That is, since seeds are formed and crystals are grown at an interface between the first metal catalyst crystallization region 160 and the second metal catalyst crystallization region 170, when a Si layer having the first and second metal catalyst crystallization regions 160 and 170 is etched several times, it can be determined that the seeds are formed in the bottom surface of the second metal catalyst crystallization region 170. Also, since the second metal catalyst crystallization region 170 is crystallized by the presence of the remaining metal catalyst of the first metal catalyst crystallization region 160, the remaining amount of metal catalyst may be smaller in the second metal catalyst crystallization region 170 than in the first metal catalyst crystallization region 160, thereby resulting in larger crystal grains in the second metal catalyst crystallization region 170.

Therefore, on the basis of the above-described differences, the first metal catalyst crystallization region 160 (i.e., first SGS crystallization region) may be distinguished from the second metal catalyst crystallization region 170 (i.e., second SGS crystallization region).

FIGS. 2A through 2D are cross-sectional views illustrating a method of forming a thin film transistor (TFT) according to an exemplary embodiment of the present invention. In describing specific structures of the TFT and of an organic light emitting diode (OLED) display device as described below, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

Figure 2A:
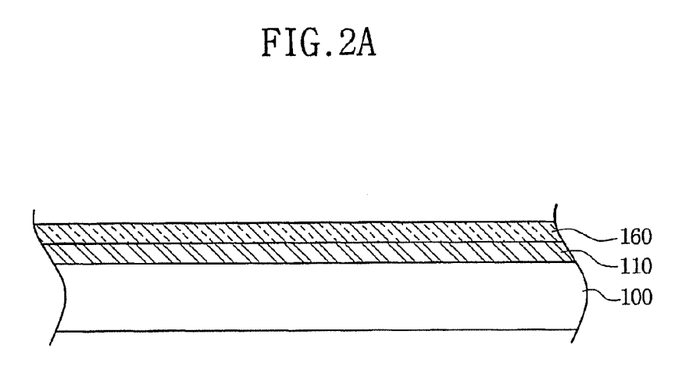
FIGS. 2A through 2D are cross-sectional views of a thin film transistor (TFT) according to an exemplary embodiment of the present invention.

Referring to FIG. 2A, the capping layer (refer to 130 in FIG. 1D) and the metal catalyst layer (refer to 140 in FIG. 1D) are removed from the substrate 100, so that the substrate 100 having the first metal catalyst crystallization region 160 formed thereon remains.

Figure 2B:
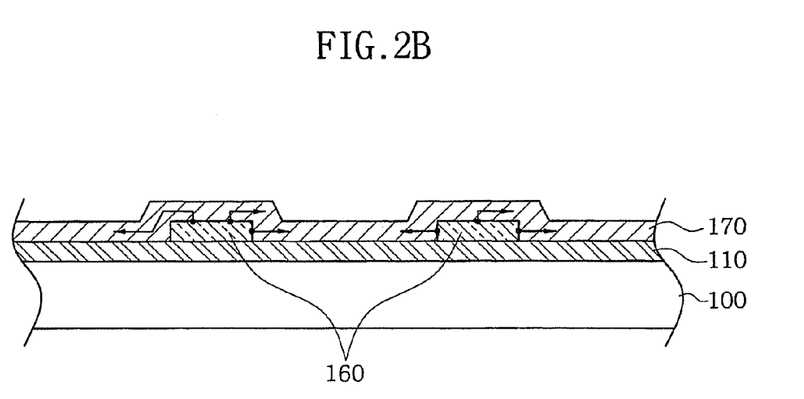
Figure 2C:
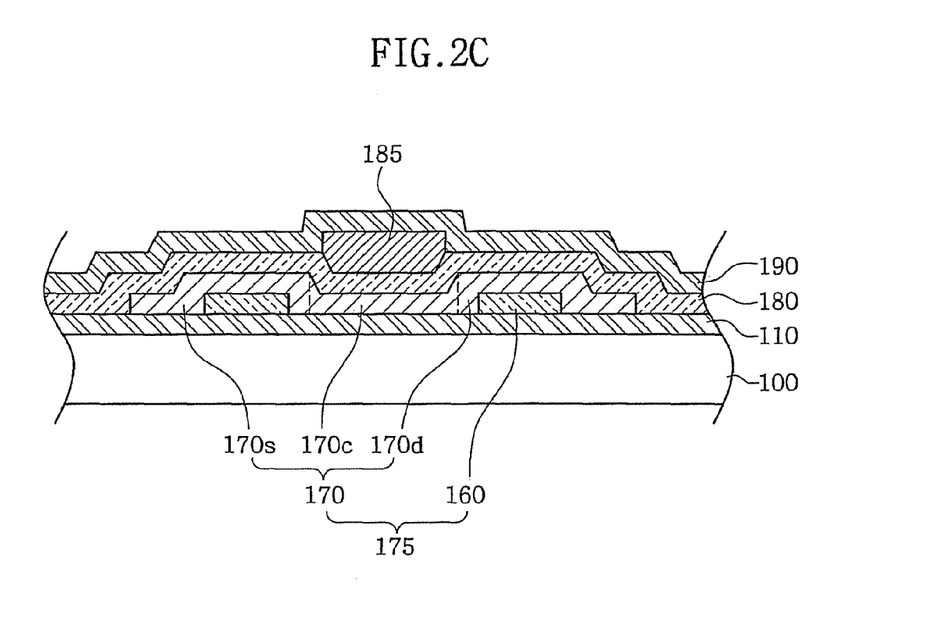

Referring to FIGS. 2B and 2C, the first metal catalyst crystallization region 160 is patterned as an island type. Thereafter, a second a-Si layer is formed on the entire surface of the substrate 100 and annealed so that a metal catalyst diffuses from the first metal catalyst crystallization region 160 into the second a-Si layer, thereby forming a second metal catalyst crystallization region 170. Afterwards, the second metal catalyst crystallization region 170 may be patterned, thereby forming a semiconductor layer 175 having the first metal catalyst crystallization region 160 and the second metal catalyst crystallization region 170.

The source and drain regions 170s and 170d of the semiconductor layer 175 may include both the first metal catalyst crystallization region 160 and the second metal catalyst crystallization region 170, and a channel region 170c of the semiconductor layer 175 may include only the second metal catalyst crystallization region 170.

The second metal catalyst crystallization region 170 may be patterned to have a larger area than the first metal catalyst crystallization region 160, which may be disposed under the source and drain regions 170s and 170d of the semiconductor layer 175. Since the first metal catalyst crystallization region 160 is disposed in the source and drain regions 170s and 170d, crystals may be grown on both sides of the channel region 170c during a diffusion process using the metal catalyst, so that the second metal catalyst crystallization region 170 can be effectively crystallized toward the channel region 170c. As noted above, the first metal catalyst crystallization region 160 is the first SGS crystallization region, while the second metal catalyst crystallization region 170 is the second SGS crystallization region. The second SGS crystallization region has unclear crystal grain boundaries and small seeds as compared with the first SGS crystallization region, so that the second SGS crystallization region has better electrical properties.

Thereafter, a gate insulating layer 180 is formed on the entire surface of the substrate 100 having the first and second metal catalyst crystallization regions 160 and 170. The gate insulating layer 180 may be a silicon oxide layer, a silicon nitride layer, or a double layer thereof.

Referring to FIG. 2C, a metal layer (not shown) for a gate electrode may be formed on the gate insulating layer 180 and etched using photolithography and etching processes, thereby forming a gate electrode 185 in a region corresponding to the channel region 170c of the semiconductor layer 175. The metal layer for the gate electrode may be a single layer formed of aluminum (Al) or an Al alloy, such as aluminum-neodymium (Al—Nd), or a double layer obtained by stacking an Al alloy layer on a chrome (Cr) or molybdenum (Mo) alloy layer.

After that, an interlayer insulating layer 190 is formed on the entire surface of the substrate 100 having the gate electrode 185. The interlayer insulating layer 190 may be a silicon nitride layer, a silicon oxide layer, or a double layer thereof.

Figure 2D:
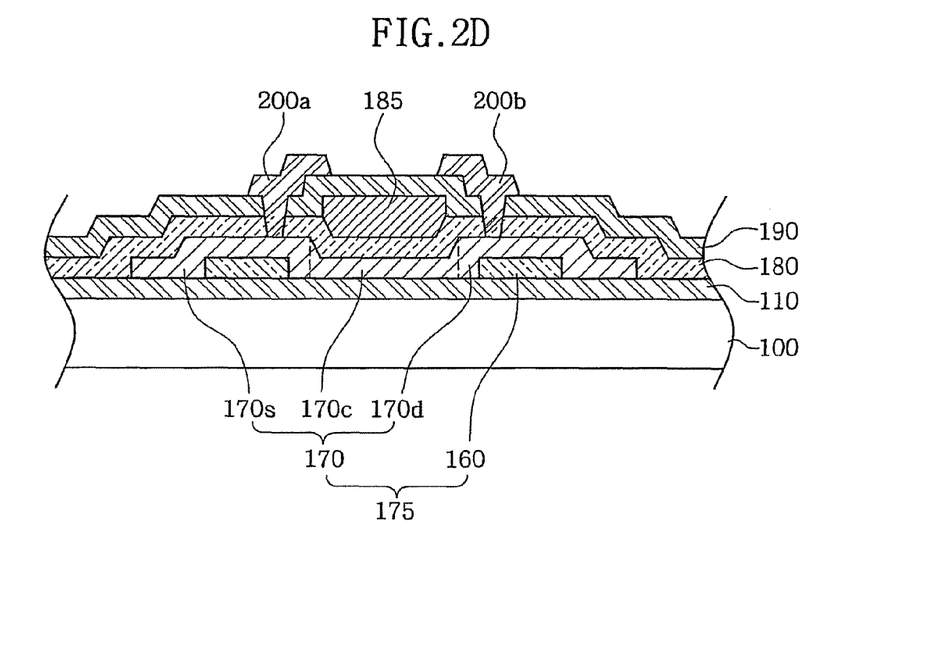

Referring to FIG. 2D, the interlayer insulating layer 190 and the gate insulating layer 180 are etched, thereby forming contact holes exposing the source and drain regions 170s and 170d of the second metal catalyst crystallization region 170. Source and drain electrodes 200a and 200b are formed through the contact holes to be connected to the source and drain regions 170s and 170d of the semiconductor layer 175. The source and drain electrodes 200a and 200b may be formed of one selected from the group consisting of molybdenum (Mo), chrome (Cr), tungsten (W), molybdenum-tungsten (MoW), aluminum (Al), aluminum-neodymium (Al—Nd), titanium (Ti), titanium nitride (TiN), copper (Cu), an Mo alloy, an Al alloy, and a copper (Cu) alloy. As a result, the fabrication of the TFT including the semiconductor layer 175, the gate electrode 185, and the source and drain electrodes 200a and 200b according to the present exemplary embodiment is completed.

Table 1 shows results of a comparison of a semiconductor layer according to an experimental example of the present invention with a conventional semiconductor layer according to a comparative example. The semiconductor layer according to the experimental example included both first and second SGS crystallization regions, while the conventional semiconductor layer included only the first SGS crystallization region.

TABLE 1

|  | Threshold voltage (Vth) | Electron mobility (cm$^2$/Vs) | S factor (V/dec) | Off-current (A/μm) | Range of driving voltage (V) |
| --- | --- | --- | --- | --- | --- |
| Experimental example | −1.82 | 59.74 | 0.48 | $3.20 \times 10^{-12}$ | −2.18 |
| Comparative example | −2.52 | 51.44 | 0.58 | $6.02 \times 10^{-12}$ | −2.38 |

According to the experimental example, as described above, after a first metal catalyst crystallization region was formed by a primary crystallization process using a metal catalyst, a second metal catalyst crystallization region was formed by a secondary crystallization process using the metal catalyst remaining in the first metal catalyst crystallization region. Thus, a semiconductor layer according to the experimental example included both the first and second SGS crystallization regions. In comparison, according to the comparative example, a first metal catalyst crystallization region was formed by a conventional SGS method using a metal catalyst. Thus, a semiconductor layer according to the comparative example included only the first SGS crystallization region.

As can be seen from Table 1, the semiconductor layer including the second metal catalyst crystallization region (i.e., the second SGS crystallization region) that is crystallized due to diffusion of seeds from the first metal catalyst crystallization region has a lower threshold voltage, higher electron mobility, and a smaller S factor than the conventional semiconductor layer including only the first metal catalyst crystallization region (i.e., the first SGS crystallization region). In addition, the second metal catalyst crystallization region according to the exemplary embodiment exhibits a good off-current characteristic.

Figure 3:
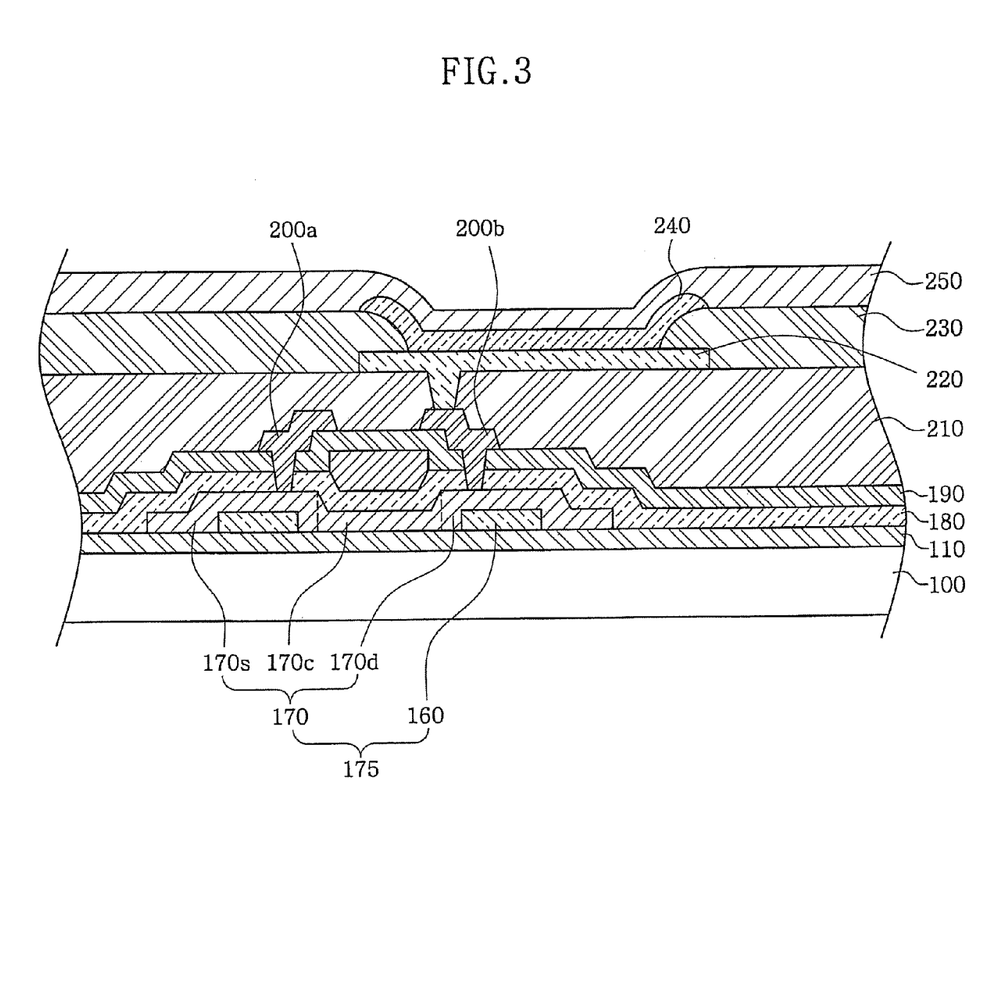
FIG. 3 is a cross-sectional view of an organic light emitting diode (OLED) display device according to an exemplary embodiment of the present invention.

FIG. 3 is a cross-sectional view of an organic light emitting diode (OLED) display device including a TFT formed according to an exemplary embodiment of the present invention.

Referring to FIG. 3, an insulating layer 210 is formed on the entire surface of the substrate 100 having the TFT shown in FIG. 2D. The insulating layer 210 may be an inorganic layer, an organic layer, or a stacked layer thereof. The inorganic layer may be one selected from the group consisting of a silicon oxide layer, a silicon nitride layer, or a spin-on-glass (SOG) layer. The organic layer may be formed of one selected from the group consisting of polyimide, benzocyclobutene series resin (BCB resin), and acrylate.

The insulating layer 210 is etched, thereby forming a via hole exposing one of the source and drain electrodes 200a and 200b. A first electrode 220 is formed through the via hole and connected to one of the source and drain electrodes 200a and 200b. The first electrode 220 may be an anode or cathode. When the first electrode 220 is an anode, the anode may be formed of a transparent conductive material selected from the group consisting of indium tin oxide (ITO), indium zinc oxide (IZO), and indium tin zinc oxide (ITZO). When the first electrode 220 is a cathode, the cathode may be formed of one selected from the group consisting of magnesium (Mg), calcium (Ca), aluminum (Al), silver (Ag), barium (Ba), and an alloy thereof.

Afterwards, a pixel defining layer 230 having an opening is formed on the first electrode 220 to expose a portion of the surface of the first electrode 220. An organic layer 240 having an emission layer (EML) is then formed on the exposed portion of the first electrode 220. The organic layer 240 may further include at least one selected from the group consisting of a hole injection layer (HIL), a hole transport layer (HTL), a hole blocking layer (HBL), an electron blocking layer (EBL), an electron injection layer (EIL), and an electron transport layer (ETL). Subsequently, a second electrode 250 is formed on the organic layer 240. As a result, the fabrication of the OLED display device according to the present exemplary embodiment may be completed.

Figure 4:
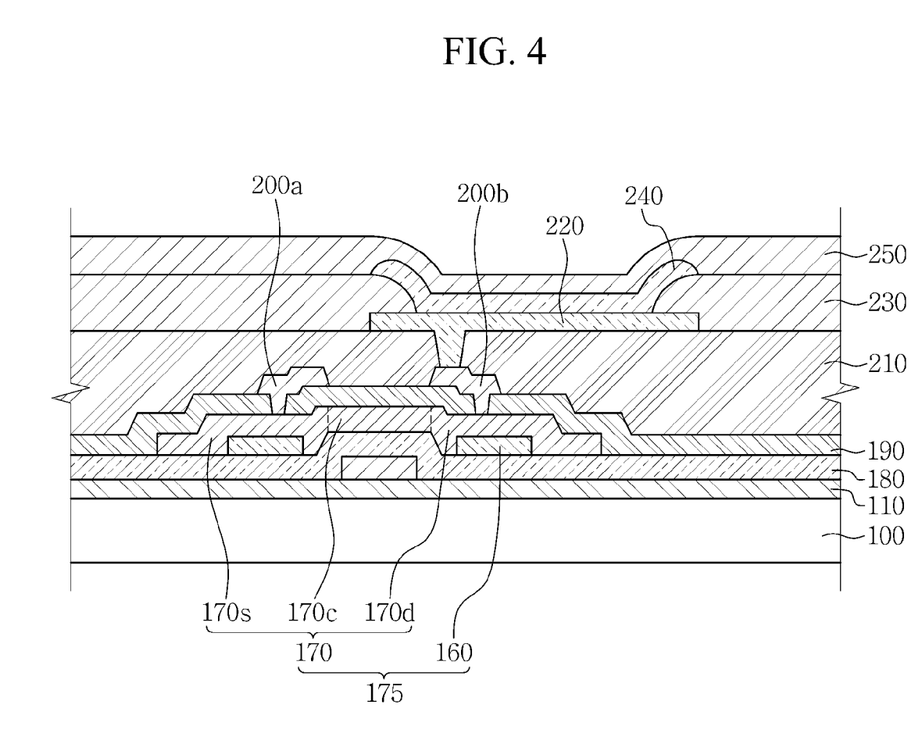
FIG. 4 is a cross-sectional view of an organic light emitting diode (OLED) display device according to an exemplary embodiment of the present invention.

Although a top-gate TFT in which a gate electrode is disposed over a semiconductor layer is described herein as an exemplary embodiment, it is to be understood that aspects of the present invention may be applied likewise to a bottom-gate TFT in which a gate electrode is disposed under a semiconductor layer, as shown in FIG. 4. Moreover, details of the structure and method of formation of the TFT and OLED display device may vary from what is described herein.

Accordingly, a semiconductor layer of a TFT and OLED display device, which is obtained using a method of forming a poly-Si layer according to exemplary embodiments of the present invention, has better characteristics and is more suitable for display devices than a conventional semiconductor layer formed using an SGS method.

As described above, aspects of the present invention provide a good semiconductor layer having larger crystal grains and a smaller remaining amount of metal catalyst than a conventional semiconductor layer formed using a metal catalyst. As a result, the semiconductor layer according to aspects of the present invention has a low threshold voltage and a good off-current characteristic, thereby improving the characteristics of a TFT and OLED display device including the semiconductor layer.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor (TFT) comprising:
a substrate;
a semiconductor layer disposed on the substrate and including source and drain regions, each having a first metal catalyst crystallization region and a second metal catalyst crystallization region, wherein the first metal catalyst crystallization region is disposed under the second metal catalyst crystallization region, wherein a grain size and structure of crystal grains of the first metal catalyst crystallization region differs from a grain size and structure of crystal grains of the second metal catalyst crystallization region, and a channel region having the second metal catalyst crystallization region;
a gate electrode disposed in a position corresponding to the channel region of the semiconductor layer;
a gate insulating layer interposed between the semiconductor layer and the gate electrode to electrically insulate the semiconductor layer from the gate electrode; and
source and drain electrodes electrically insulated from the gate electrode and electrically connected to the source and drain regions, respectively,
wherein the second metal catalyst crystallization region directly covers a top surface, a first side surface, and a second side surface of the first metal catalyst crystallization region in the source and drain regions.

2. The TFT according to claim 1, wherein the gate electrode is disposed over the semiconductor layer.

3. The TFT according to claim 1, wherein the gate electrode is disposed under the semiconductor layer.

4. The TFT according to claim 1, wherein the crystal grains of the second metal catalyst crystallization region are larger than the crystal grains of the first metal catalyst crystallization region.

5. The TFT according to claim 1, wherein the crystal grains of the second metal catalyst crystallization region are about 3 to 4 times as large as the crystal grains of the first metal catalyst crystallization region.

6. The TFT according to claim 1, wherein crystal grain boundaries of the crystal grains of the second metal catalyst crystallization region are smaller and less defined than crystal grain boundaries of the crystal grains of the first metal catalyst crystallization region, such that the second metal catalyst crystallization region has smaller barriers to charge transport than the first metal catalyst crystallization region.

7. The TFT according to claim 1, further comprising an insulating layer disposed over or under the source and drain electrodes.

8. A method of fabricating a thin film transistor (TFT), comprising:
forming a semiconductor layer on a substrate, the semiconductor layer including source and drain regions, each having a first metal catalyst crystallization region and a second metal catalyst crystallization region, wherein the first metal catalyst crystallization region is disposed under the second metal catalyst crystallization region, and a channel region having the second metal catalyst crystallization region;
forming a gate electrode in a position corresponding to the channel region of the semiconductor layer;

forming a gate insulating layer between the semiconductor layer and the gate electrode to electrically insulate the semiconductor layer from the gate electrode;

forming source and drain electrodes to be electrically connected to the source and drain regions, respectively;

forming a first insulating layer under the source and the drain electrodes; and forming a second insulating layer over the source and drain electrodes, wherein the second metal catalyst crystallization region directly covers a top surface, a first side surface, and a second side surface of the first metal catalyst crystallization region in the source and drain regions.

9. The method according to claim 8, wherein the forming of the first metal catalyst crystallization region comprises:

forming a capping layer and a metal catalyst layer on a first amorphous silicon layer; and annealing the substrate having the capping layer and the metal catalyst layer.

10. The method according to claim 8, wherein forming the second metal catalyst crystallization region comprises:

forming a second amorphous silicon layer on the first metal catalyst crystallization region; and annealing the substrate having the second amorphous silicon layer.

11. The method according to claim 8, wherein the metal catalyst includes one selected from the group consisting of nickel (Ni), palladium (Pd), silver (Ag), gold (Au), aluminum (Al), tin (Sn), antimony (Sb), copper (Cu), terbium (Tr), and cadmium (Cd).

12. The method according to claim 8, wherein the first metal catalyst crystallization region of the semiconductor layer is patterned to have a smaller area than the second metal catalyst crystallization region thereof.

13. An organic light emitting diode (OLED) display device comprising:

a substrate;

a semiconductor layer disposed on the substrate and including source and drain regions, each having a first metal catalyst crystallization region and a second metal catalyst crystallization region, wherein the first metal catalyst crystallization region is disposed under the second metal catalyst crystallization region, wherein a grain size and structure of crystal grains of the first metal catalyst crystallization region differs from a grain size and structure of crystal grains of the second metal catalyst crystallization region, and a channel region having the second metal catalyst crystallization region;

a gate electrode disposed in a position corresponding to the channel region of the semiconductor layer;

a gate insulating layer interposed between the semiconductor layer and the gate electrode to electrically insulate the semiconductor layer from the gate electrode;

source and drain electrodes electrically insulated from the gate electrode and electrically connected to the source and drain regions, respectively; and a first electrode, an organic layer, and a second electrode electrically connected to the source and drain electrodes, wherein the second metal catalyst crystallization region directly covers a top surface, a first side surface, and a second side surface of the first metal catalyst crystallization region in the source and drain regions.

14. The OLED display device according to claim 13, wherein the gate electrode is disposed over the semiconductor layer.

15. The OLED display device according to claim 13, wherein the gate electrode is disposed under the semiconductor layer.

16. The OLED display device according to claim 13, wherein crystal grains of the second metal catalyst crystallization region are larger than crystal grains of the first metal catalyst crystallization region.

17. The OLED display device according to claim 15, further comprising an insulating layer disposed over or under the source and drain electrodes.

18. A semiconductor layer disposed on a substrate, the semiconductor layer comprising:

a source region and a drain region;

a first metal catalyst crystallization region formed in the source and drain regions; and a second metal catalyst crystallization region formed in the source and drain regions and disposed to cover the first metal catalyst crystallization region, the first metal catalyst crystallization region being disposed under the second metal catalyst crystalline region, wherein crystal grains of the second metal catalyst crystallization region are larger than crystal grains of the first metal catalyst crystallization region, and wherein the second metal catalyst crystallization region directly covers a to surface, a first side surface, and a second side surface of the first metal catalyst crystallization region in the source and drain regions.

19. The semiconductor layer of claim 18, wherein the first metal catalyst crystallization region is patterned and wherein the semiconductor layer includes source and drain regions that include both the first metal catalyst crystallization region and the second metal catalyst crystallization region and a channel region that includes the second metal catalyst crystallization region and does not include the first metal catalyst crystallization region.

20. A method of forming a semiconductor layer including a first metal catalyst crystallization region and a second metal catalyst crystallization region, the method comprising:

forming a first amorphous silicon layer on a substrate;

forming a metal catalyst layer on the first amorphous silicon layer;

annealing the substrate having the first amorphous silicon layer formed thereon such that the first amorphous silicon layer is crystallized to form the first metal catalyst crystallization region;

forming a second amorphous silicon layer on the first metal catalyst crystallization region; and annealing the substrate having the first metal catalyst crystallization region and the second amorphous silicon layer formed thereon such that the second amorphous silicon layer is crystallized to form the second metal catalyst crystallization region.

21. The method of claim 20, further including, before the annealing to form the first metal catalyst crystallization region, forming a capping layer on the first amorphous silicon layer and annealing the substrate having the first amorphous silicon layer, the capping layer and the metal catalyst layer formed thereon such that an amount of metal catalyst from the metal catalyst layer diffuses through the capping layer to contact the first amorphous silicon layer.

22. The method of claim 21, further including removing the metal catalyst layer and the capping layer after the annealing in which the metal catalyst diffuses through the capping layer to contact the first amorphous silicon layer and before the annealing to form the first metal catalyst crystallization region.

23. The method of claim 20, further including patterning the first metal catalyst crystallization region to form islands before the forming of the second amorphous silicon layer thereon, and wherein, in the forming of the second amorphous silicon layer on the first metal catalyst crystallization region, the second amorphous silicon layer is also formed directly on portions of the substrate between the islands of the first metal catalyst layer.

24. The method of claim 20, further including patterning the second metal catalyst crystallization region such that the semiconductor layer includes source and drain regions that include both the first metal catalyst crystallization region and the second metal catalyst crystallization region and a channel region that includes the second metal catalyst crystallization region and does not include the first metal catalyst crystallization region.

25. The TFT according to claim 1, wherein a thickness of the semiconductor layer at the channel region is less than a thickness of the semiconductor layer at the source region and a thickness of the semiconductor layer at the drain region.

26. The method of claim 20, wherein the second metal catalyst crystallization region is formed using metal catalyst from the first metal catalyst crystallization region.

\* \* \* \* \*